(12) United States Patent
Kim et al.

(10) Patent No.: US 6,531,362 B1
(45) Date of Patent: Mar. 11, 2003

(54) METHOD FOR MANUFACTURING A SEMICONDUCTOR DEVICE

(75) Inventors: Jin-Hyun Kim, Ichon-shi (KR); In-Haeng Lee, Ichon-shi (KR)

(73) Assignee: Hyundai Electronics Industries Co. Ltd. (KR)

( * ) Notice: Subject to any disclaimer, the term of this patent is extended or adjusted under 35 U.S.C. 154(b) by 7 days.

(21) Appl. No.: 09/607,521

(22) Filed: Jun. 28, 2000

(30) Foreign Application Priority Data

Jun. 28, 1999 (KR) .......................... 99-24847

(51) Int. Cl.⁷ .............................. H01L 21/336
(52) U.S. Cl. ................. 438/258; 438/241; 438/253; 438/254; 438/396; 438/397
(58) Field of Search ................. 438/258, 241, 438/253, 254, 396, 397, 275, 279

(56) References Cited

U.S. PATENT DOCUMENTS

| | | | |
|---|---|---|---|
| 5,169,491 A | 12/1992 | Doan | 438/693 |
| 5,284,787 A | 2/1994 | Ahn | |
| 5,478,768 A | 12/1995 | Iwasa | |
| 5,518,948 A | 5/1996 | Walker | |
| 5,552,346 A | 9/1996 | Huang et al. | 438/699 |
| 5,736,450 A | 4/1998 | Huang et al. | |
| 5,780,338 A | 7/1998 | Jeng et al. | |
| 5,804,479 A * | 9/1998 | Aoki et al. | 438/253 |
| 5,807,777 A | 9/1998 | Wu | |
| 5,821,141 A | 10/1998 | Huang | |
| 5,828,096 A | 10/1998 | Ohno et al. | |
| 5,880,039 A | 3/1999 | Lee | 438/624 |
| 5,907,772 A | 5/1999 | Iwasaki | |
| 5,960,293 A | 9/1999 | Hong et al. | |
| 5,972,789 A | 10/1999 | Jeng et al. | |
| 5,981,369 A * | 11/1999 | Yoshida et al. | 438/241 |
| 6,271,123 B1 | 8/2001 | Jang et al. | 438/633 |
| 6,271,124 B1 | 8/2001 | Choi et al. | 438/253 |
| 6,352,891 B1 | 3/2002 | Kasai | 438/241 |
| 6,368,906 B1 | 4/2002 | Shin et al. | 438/210 |
| 2001/0005058 A1 * | 6/2001 | Asano et al. | 257/775 |

FOREIGN PATENT DOCUMENTS

| | | |
|---|---|---|
| JP | 3174767 | 7/1991 |
| JP | 575058 | 3/1993 |
| JP | 590493 | 4/1993 |
| JP | 5304252 | 11/1993 |
| JP | 9213903 | 8/1997 |
| JP | 9237874 | 9/1997 |
| JP | 1093042 | 4/1998 |
| JP | 10256500 | 9/1998 |
| JP | 11121707 | 4/1999 |
| JP | 11204746 | 7/1999 |

OTHER PUBLICATIONS

Wolf et al. "Silicon Processing for the VLSI Era, vol. 1—Process Technology", Lattice Press, 1986, pp. 529–535, and 539–542.*

* cited by examiner

Primary Examiner—John F. Niebling
Assistant Examiner—Jennifer M. Kennedy
(74) Attorney, Agent, or Firm—Blakely Sokoloff Taylor & Zafman

(57) ABSTRACT

A method for manufacturing a semiconductor device incorporating therein an insulating layer prevents a bridge between metal patterns. The method begins with the preparation a semiconductor substrate divided into a peripheral region and a cell region provided with a first metal pattern formed thereon, wherein the regions are adjacent to each other. Thereafter, a first insulating layer is covered on top of the first metal pattern. And then, a second insulating layer is formed on top of the first insulating layer, wherein an etching rate of the first insulating layer is slower than that of the second insulating layer. In the next step, the second insulating layer is planarized to a predetermined thickness for smoothing a step contour between the cell region and the peripheral region. Finally, a second metal pattern is formed on top of the planarized second insulating layer, thereby preventing a bridge between the first and the second metal patterns.

16 Claims, 6 Drawing Sheets

METHOD FOR MANUFACTURING A SEMICONDUCTOR DEVICE

FIELD OF THE INVENTION

The present invention relates to a method for manufacturing a semiconductor device; and, more particularly, to an improved method for manufacturing a semiconductor device incorporating therein an insulating layer for preventing metal patterns from bridging therebetween.

DESCRIPTION OF THE PRIOR ART

In recent years, as a dynamic random access memory (DRAM) is integrated more and more to a higher level, a size of cell tends to be further reduced. However, to improve endurance against a soft error, the capacitor must secure a certain area on a silicon substrate.

A cylindrical capacitor with a three-dimensional structure has been introduced to solve the problem.

In FIGS. 1A and 1B, there is illustrated a prior art method for manufacturing a semiconductor device having a plurality of cylindrical capacitors at a cell region 24 of a silicon substrate 2. In the beginning, after a multiple number of gates 6 and a plurality of junctions 4 are formed in the cell region 24 of the silicon substrate 2. Thereafter, the cylindrical capacitors are electrically connected to the junction 4 through a plurality of plugs 10, respectively. Each cylindrical capacitor has a lower electrode 12, a side wall 14 formed around the lower electrode 12, a dielectric layer 16 formed on top of the lower electrode 12 and a upper electrode 18 formed on top of the dielectric layer 16. In the next step, a borophosphosilicate glass (BPSG) layer 20 is deposited on top of the upper electrode 18 of the cylindrical capacitors and a peripheral region 26 of the silicon substrate 2. In general, the BPSG layer 20 is used as an insulating layer interlayered between metal patterns. The BPSG layer 20 is reflowed to planarize the surface thereof. And then, a photoresist layer 22 is formed on top of the BPSG layer 20 of the peripheral region 26, as shown in FIG. 1A.

In order to further smooth a step contour between the cell region 24 and the peripheral region 26, a portion 27 of the BPSG layer 20 must be etched back to a desired thickness, wherein the desired thickness is represented as a dot line in FIG. 1A.

A polysilicon plug 28 is formed on top of the BPSG layer 20 at the peripheral region 26. Finally, a redundancy word line 30 is formed on top of the planarized BPSG layer 20 with extending to the polysilicon plug 28.

There are certain deficiencies associated with the above-described method for manufacturing the semiconductor device during the planarizing process. For example, it is difficult to etch the portion 27 of the BPSG layer 20 without exposing an edge portion 32 of the upper electrode 18, because a thickness of the BPSG layer 20 at the edge portion 32 is smaller than that of the portion 27 on top of the plug 10. In this result, a bridge is frequently occurred between the edge portion 32 of the upper electrode 18 and the redundancy word line 30, which, in turn, degrades the overall performance of the semiconductor device.

BRIEF DESCRIPTION OF THE DRAWINGS

The above and other objects and features of the present invention will become apparent from the following description of preferred embodiments given in conjunction with the accompanying drawings, in which.

SUMMARY OF THE INVENTION

It is, therefore, an object of the present invention to provide a method for manufacturing a semiconductor device with preventing a bridge between metal patterns.

In accordance with one aspect of the present invention, there is provided a method for manufacturing a semiconductor device, comprising steps of: preparing a semiconductor substrate divided into a peripheral region and a cell region provided with a first metal pattern formed thereon, wherein the regions are adjacent to each other; covering at least of a portion of the first metal pattern with a first insulating layer; forming a second insulating layer on top of the first insulating layer, a remaining portion of the cell region and the peripheral region, wherein an etching rate of the first insulating layer is slower than that of the second insulating layer; planarizing the second insulating layer to a predetermined thickness for smoothing a step contour between the cell region and the peripheral region; and forming a second metal pattern on top of the planarized second insulating layer, thereby preventing a bridge between the first and the second metal patterns.

In accordance with another aspect of the present invention, there is provided a semiconductor device having a peripheral region and a cell region formed thereon a three-dimensional capacitor comprising: a upper electrode of the three-dimensional capacitor; a metal patterned line; a first insulating layer formed on top of the upper electrode; and a second insulating layer formed between the first insulating layer and the metal patterned layer, wherein an etching rate of the first insulating layer is slower than that of the second insulating layer.

DETAILED DESCRIPTION OF THE PREFERRED EMBODIMENTS

Referring to FIGS. 2 and 3, there are illustrated methods for manufacturing a semiconductor device in accordance with preferred embodiments of the present invention.

There are illustrated in FIGS. 2A to 2F schematic cross sectional views setting forth the steps involved in manufacturing a semiconductor device in accordance with a first preferred embodiment of the present invention.

Figure 1A:
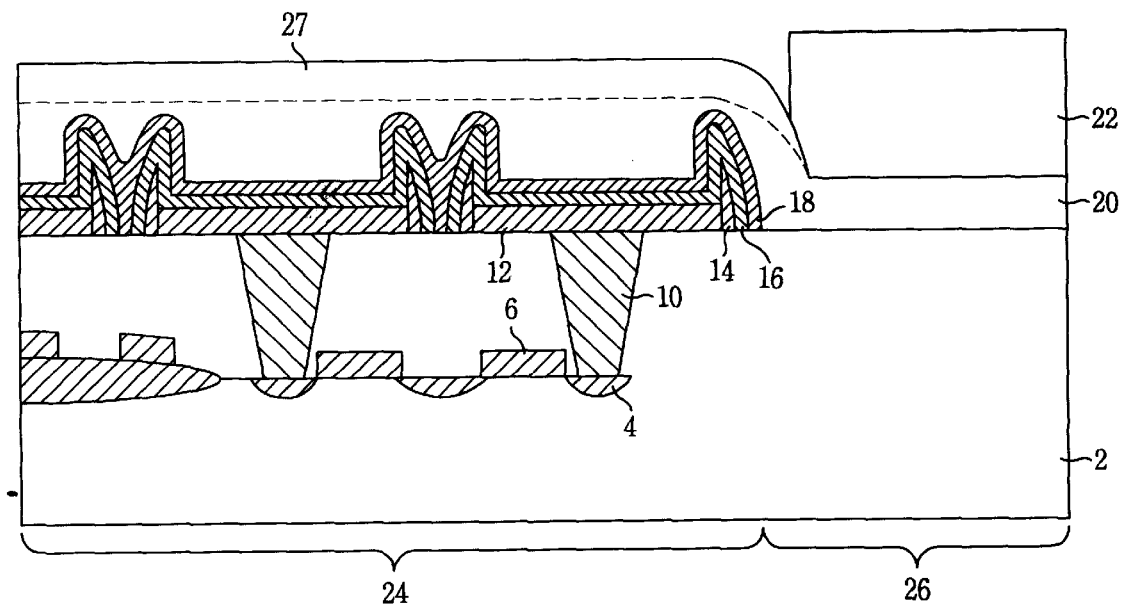
FIGS. 1A and 1B present schematic cross sectional views setting forth a prior art method for manufacturing a semiconductor device incorporating therein a plurality of cylindrical capacitors.
Figure 1B:
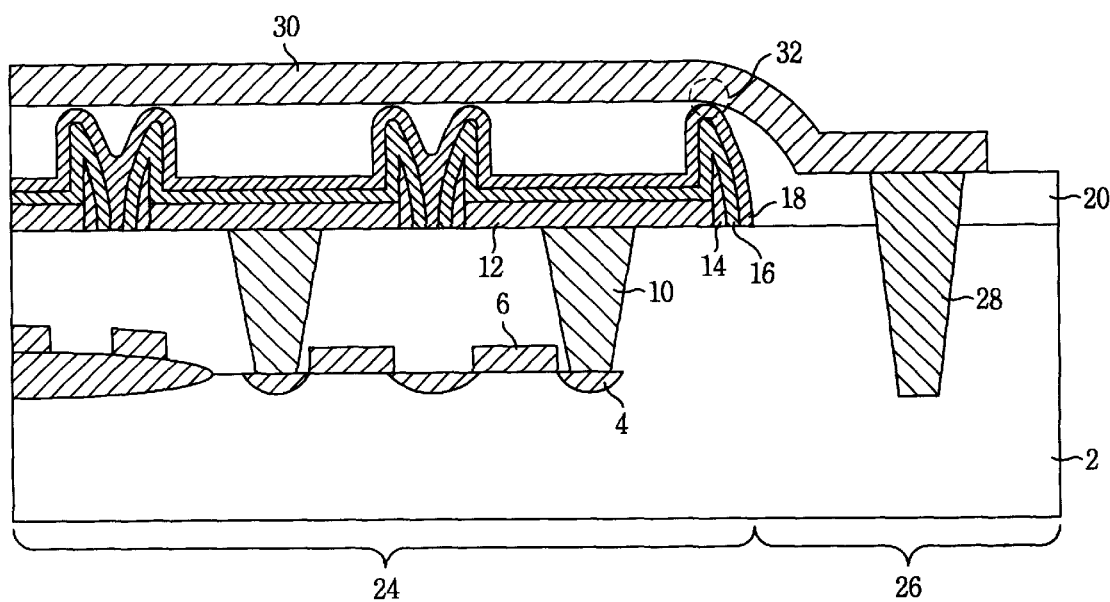
Figure 2A:
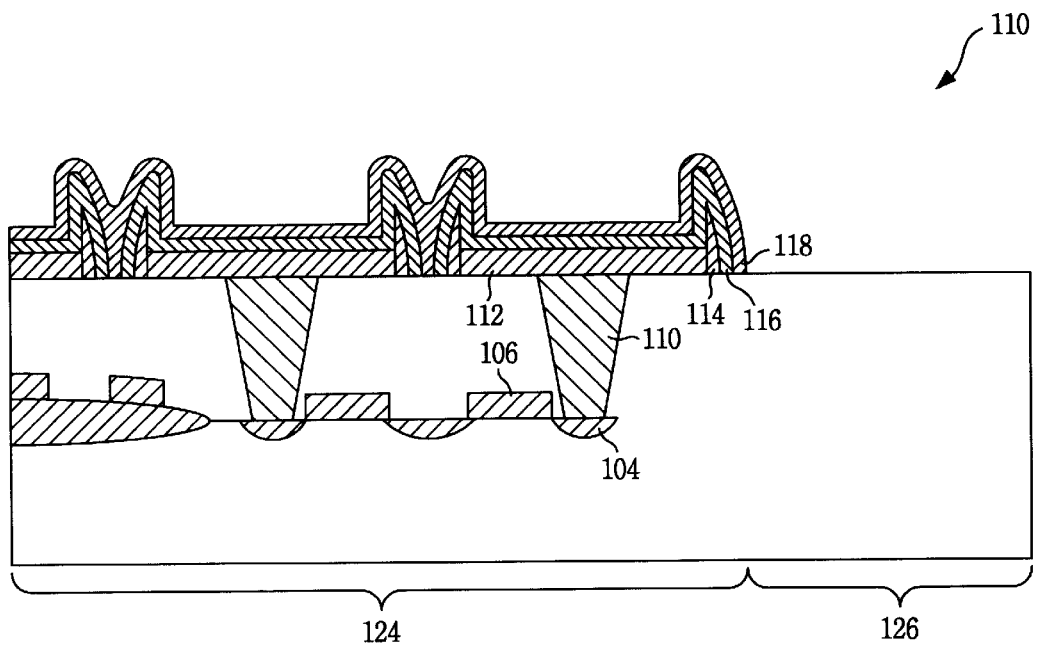
FIGS. 2A to 2F provide schematic cross sectional views illustrating a method for manufacturing a semiconductor device in accordance with a first preferred embodiment of the present invention.

The process for the manufacture of the semiconductor device begins with making a semiconductor substrate 110 divided into a peripheral region 126 and a cell region 124 whereon a plurality of cylindrical capacitors is formed, as shown in FIG. 2A. Each of the cylindrical capacitors comprises a lower electrode 112, a side wall 114 formed around the lower electrode 112, a dielectric layer 116 formed on top of the lower electrode 112 and the side wall 114, and an upper electrode 118 on top of the dielectric layer 116. Each cylindrical capacitor is connected to a gate 106 through a junction 104 to store and discharge electrical charges.

Figure 2B:
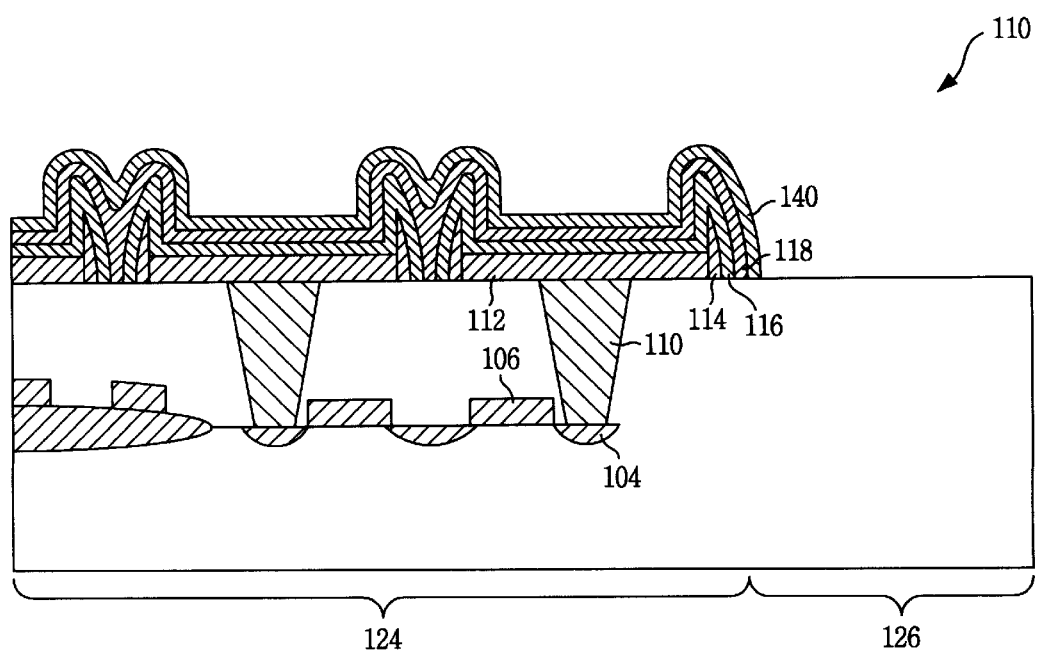

In a subsequent step, a first insulating layer 140 is formed on top of the upper electrodes 118 of the cylindrical capacitors by using a method such as a chemical vapor deposition (CVD), as illustrated in FIG. 2B. In accordance with the first preferred embodiment of the present invention, it is preferable that the first insulating layer 140 is made of a material such as a tetraethyl orthosilicate (TEOS), a medium temperature oxide (MTO) and the like. An etching rate of the first insulating layer 140 is slower than that of a material to be formed thereon. In the first preferred embodiment, a thickness of the first insulating layer 140 is ranged from approximately 50 Å to approximately 1,500 Å.

Figure 2C:
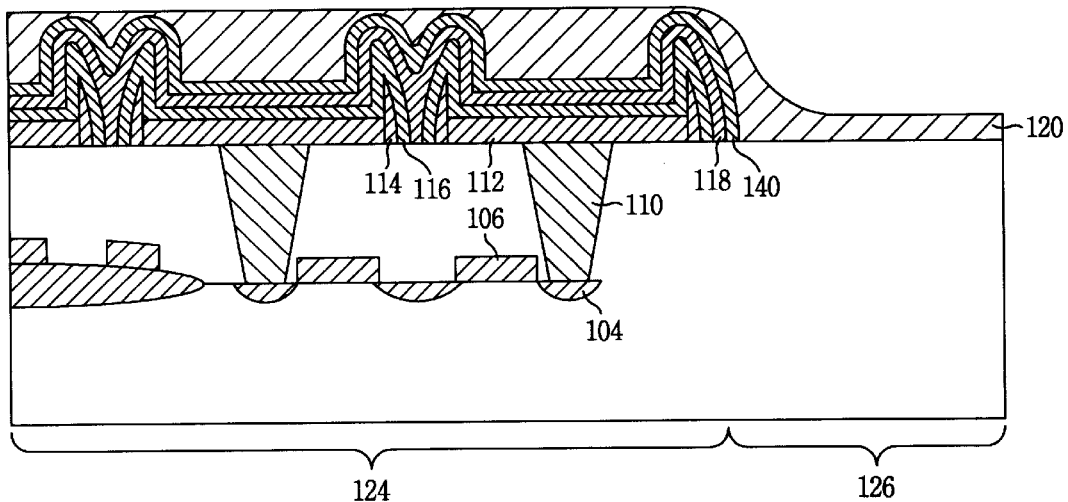

In the next step, a second insulating layer 120, e.g., a borophosphosilicate glass (BPSG), is deposited on top of the first insulating layer 140 and the peripheral region 126 of the silicon substrate 110. It is preferable that the deposition process is carried out at approximately 350° C. to approximately 600° C. After the deposition process, the second insulating layer 120 is heat-treatmented by reflowing it in a furnace at approximately 600° C. to approximately 1,000° C. The heat-treatment process can be carried out by a rapid thermal process (RTP). It is preferable that a thickness of the second insulating layer 120 is approximately 3,000 Å to approximately 15,000 Å. Then, the second insulating layer 120 is wet etched to a predetermined thickness by using a solution, thereby obtain a planarized second insulating layer 120 as shown in FIG. 2C. The solution can be prepared by mixing $NH_4F$ and HF. The etching process can be carried out by using a dry etching.

Figure 2D:
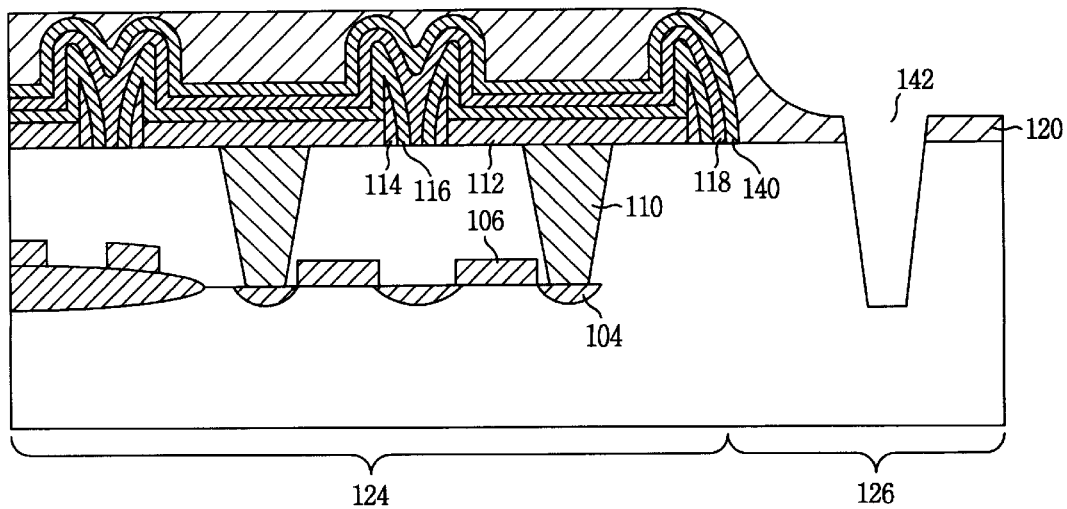

In a subsequence step, a conduit 142 is formed on the peripheral region 126, as shown in FIG. 2D.

Figure 2E:
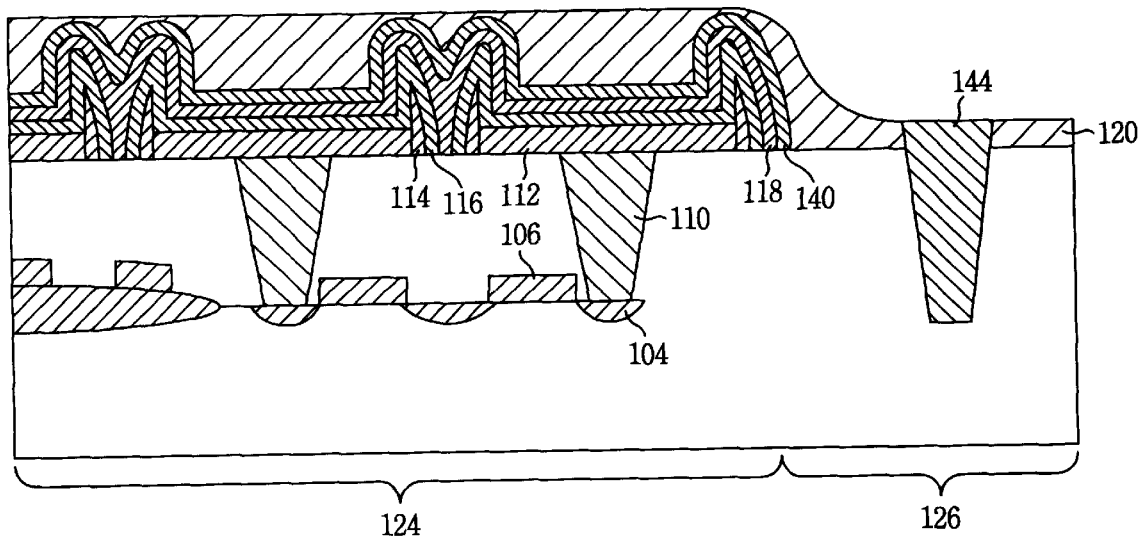

Thereafter, an insulating material 144 is stuffed into the conduit 142, as shown in FIG. 2E.

Finally, a metal layer is formed on top of the second insulating layer 120 and the insulating material 144, and the metal layer is patterned into a predetermined configuration to obtain a patterned metal layer 146 as a redundancy word line.

In comparison with the prior art method for manufacturing a semiconductor device, the first preferred embodiment is capable of planarizing the second insulating layer to a desired level without making a bridge between an edge portion 150 of the upper electrode 118 and the redundancy word line 146. This is achieved by forming the first insulating layer 140, its etching rate being slower than that of the second insulating layer, is formed on top of the upper electrode 118.

Figure 3A:
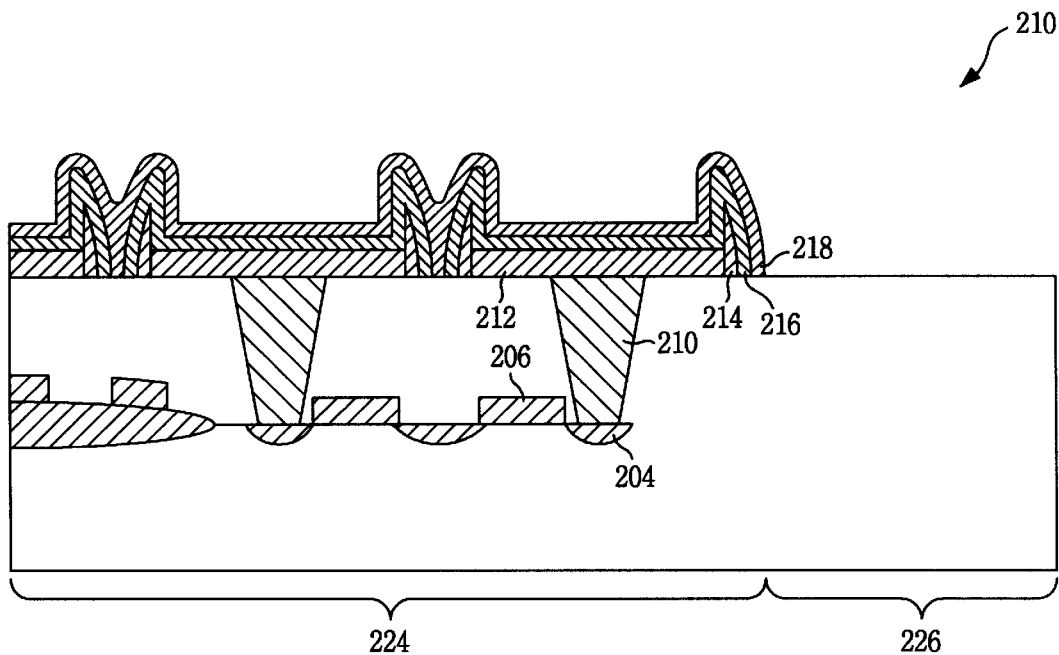
FIGS. 3A to 3D represent schematic cross sectional views showing a method for manufacturing a semiconductor device in accordance with a second preferred embodiment of the present invention.

Alternatively, in FIGS. 3A to 3D, there are shown schematic cross sectional views of manufacturing a semiconductor device in accordance with a second preferred embodiment of the present invention. In the second preferred embodiment, the step for preparing a semiconductor substrate 210 in FIG. 3A is similar to that of the first preferred embodiment shown in FIG. 2A.

Figure 3B:
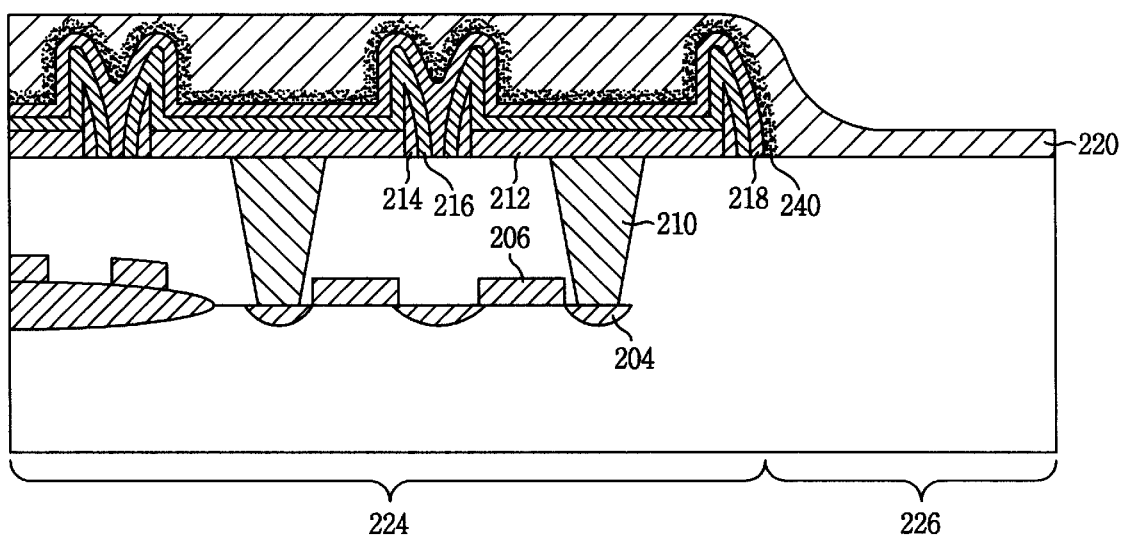

In the next step, a undoped silicate glass (USG) layer 240 is formed by controlling a deposition condition of a BPSG layer 220. That is, during a preset time, the BPSG layer 220 is formed with preventing boron (B) and phosphor (P) reactive gases to flow into and controlling a conveyer belt speed, as shown in FIG. 3B. If a thickness of the second insulating layer 220 is approximately 3,000 Å to approximately 15,000 Å, it is preferable that a thickness of the USG layer 240 is approximately 50 Å to approximately 1,500 Å.

Figure 2F:
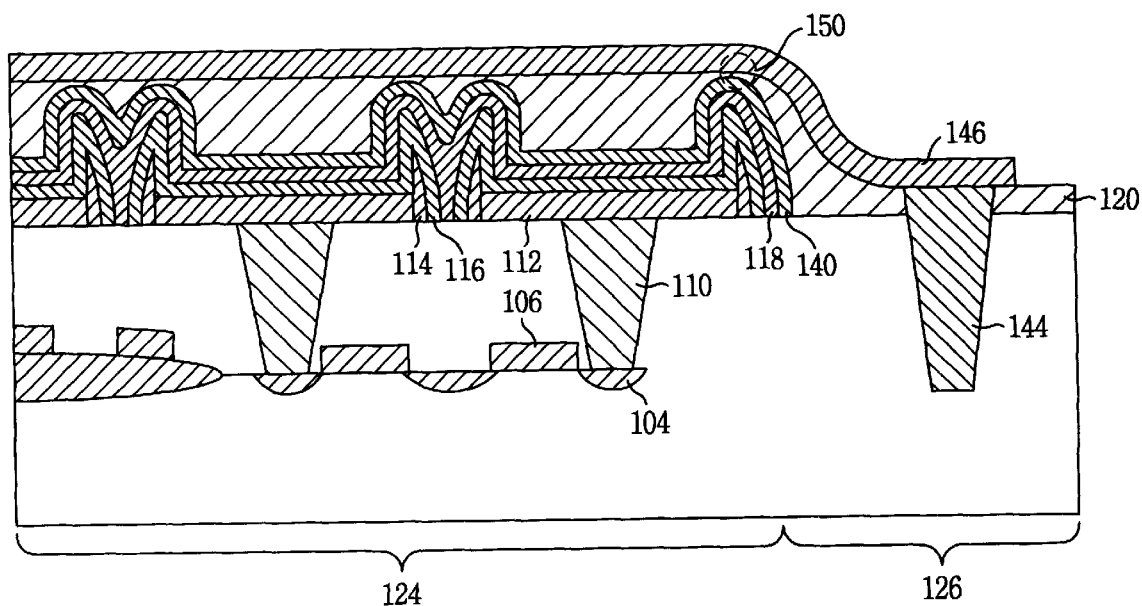
Figure 3C:
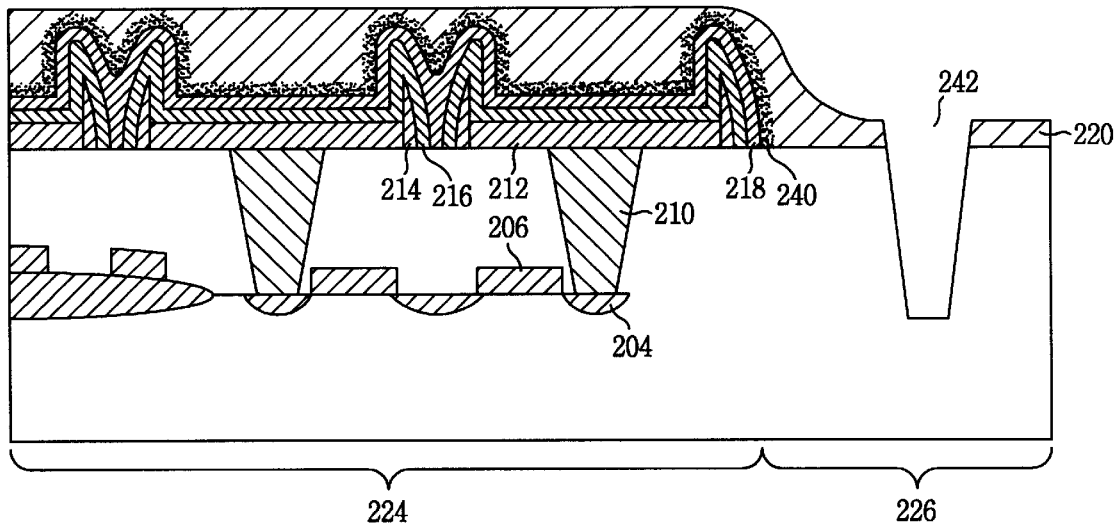
Figure 3D:
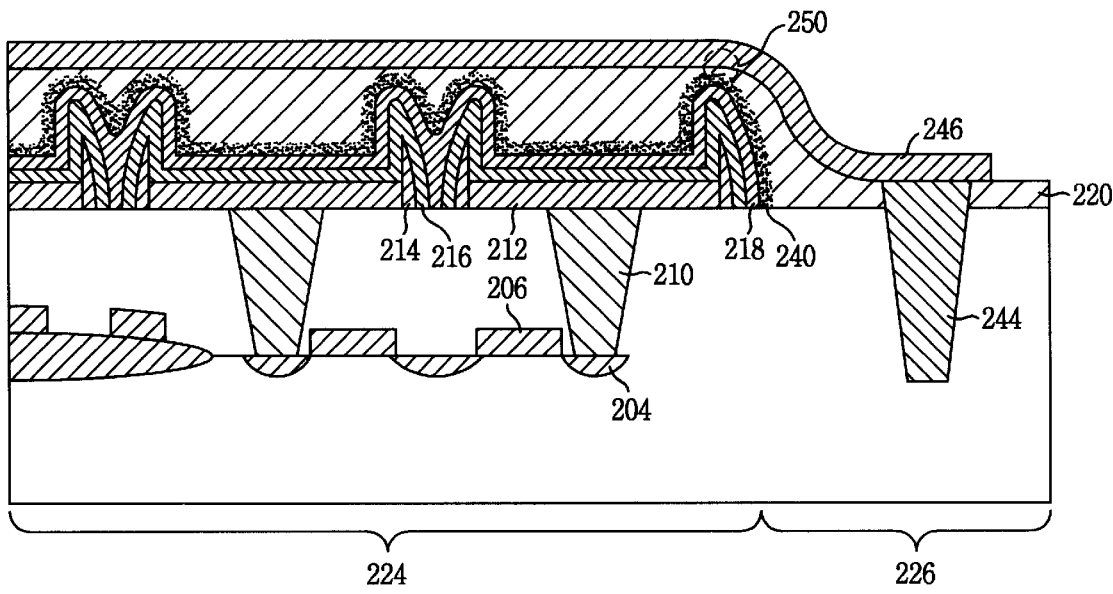

Thereafter, other steps of the second preferred embodiment shown in FIGS. 3C and 3D are similar to those of the first preferred embodiment shown in FIGS. 2D to 2F.

Since the second preferred embodiment makes the USG layer 240 to be formed during the formation of the BPSG layer 220, it does not need an additional process for depositing a first insulating layer 140 such as an MTO in comparison with the first preferred embodiment.

While the present invention has been described with respect to certain preferred embodiments only, other modifications and variations may be made without departing from the sprit and scope of the present invention as set forth in the following claims.

What is claimed is:

1. A method for manufacturing a semiconductor device, the method comprising:

preparing a semiconductor substrate divided into a peripheral region and a cell region provided with a first metal pattern formed thereon, wherein the regions are adjacent to each other;

forming a first and a second insulating layers on top of the first metal pattern, a portion of the cell region and the peripheral region, wherein the second insulating layer is formed with a borophosphosilicate glass (BPSG) and the first insulating layer is formed with an undoped silicate glass by controlling a deposition condition of the BPSG layer during an initial preset time;

planarizing the second insulating layer to a predetermined thickness for smoothing a step contour between the cell region and the peripheral region; and forming a second metal pattern on top of the planarized second insulating layer, thereby preventing a bridge between the first and the second metal patterns.

2. The method as recited in claim 1, wherein the first insulating layer is formed at an edge of the first metal pattern.

3. The method as recited in claim 2, wherein the portion of the first insulating layer extends with whole top surface of the cell region.

4. The method as recited in claim 1, wherein the first metal pattern is an upper electrode of a capacitor and a second metal pattern is a redundancy word line.

5. The method as recited in claim 1, forming the second insulating layer further comprises reflowing the BPSG at approximately 600° C. to approximately 1000° C. by a rapid thermal processing for a heat treatment thereof.

6. The method as recited in claim 1, wherein a thickness of the BPSG layer is ranged from approximately 3,000 Å to approximately 15,000 Å.

7. The method as recited in claim 1, wherein a wt % boron (B) and a wt % phosphor (P) of the BPSG layer is approximately 2 to approximately 6.

8. The method as recited in claim 1, wherein a thickness of the first insulating layer is ranged from approximately 50 Å to approximately 1,500 Å.

9. The method as recited in claim 1, wherein a deposition temperature of the BPSG layer is approximately 350° C. to approximately 600° C.

10. The method as recited in claim 1, wherein the planarizing is carried out by a wet etching.

11. The method as recited in claim 1, wherein the planarizing is carried out by a dry etching.

12. A method for manufacturing a semiconductor device, the method comprising:

preparing a semiconductor substrate divided into a peripheral region and a cell region provided with a first metal pattern formed thereon, wherein the regions are adjacent to each other;

forming a first and a second insulating layers on top of the first metal pattern, a portion of the cell region and the peripheral region, wherein the second insulating layer is formed with a borophosphosilicate glass (BPSG) and the first insulating layer is made by extracting B and P impurities from a bottom portion of the second insulating planarizing the second insulating layer to a predetermined thickness for smoothing a step contour between the cell region and the peripheral region; and forming a second metal pattern on top of the planarized second insulating layer, thereby preventing a bridge between the first and the second metal patterns.

13. The method as recited in claim 12, wherein the first insulating layer is formed at an edge of the first metal pattern.

14. The method as recited in claim 13, wherein the portion of the first insulating layer extends with whole top surface of the cell region.

15. The method as recited in claim 14, the second insulating layer is made by controlling a deposition condition of the BPSG layer during an initial preset time.

16. The method as recited in claim 12, wherein the first metal pattern is an upper electrode of a capacitor and a second metal pattern is a redundancy word line.

* * * * *